(12) United States Patent
Takahashi et al.

(10) Patent No.: US 6,577,541 B2
(45) Date of Patent: Jun. 10, 2003

(54) SEMICONDUCTOR INTEGRATED CIRCUIT DEVICE AND CONTROL METHOD THEREFOR

(75) Inventors: Miwaka Takahashi, Kyoto (JP); Toshiyuki Yokoyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 146 days.

(21) Appl. No.: 09/931,097

(22) Filed: Aug. 17, 2001

(65) Prior Publication Data

US 2002/0041528 A1 Apr. 11, 2002

(30) Foreign Application Priority Data

Oct. 5, 2000 (JP) ........................................ 2000-305655

(51) Int. Cl.[7] ................................................. G11C 7/00
(52) U.S. Cl. ............................ 365/189.01; 365/189.03; 365/226; 365/228; 365/185.02; 365/230.03
(58) Field of Search ....................... 365/189.01, 189.03, 365/185.02, 226, 228, 230.03

(56) References Cited

U.S. PATENT DOCUMENTS

| | | | | |
|---|---|---|---|---|
| 5,619,452 A | * | 4/1997 | Miyauchi | 365/185.29 |
| 5,677,885 A | * | 10/1997 | Roohparvar | 365/201 |
| 5,880,966 A | | 3/1999 | Hogan | |
| 6,047,346 A | * | 4/2000 | Lau et al. | 327/158 |
| 6,064,585 A | | 5/2000 | Mori et al. | |
| 2001/0007091 A1 | * | 7/2001 | Walter et al. | 702/107 |
| 2002/0039032 A1 | * | 4/2002 | Uchida | 324/765 |
| 2002/0190708 A1 | * | 12/2002 | Harrington et al. | 324/200 |

* cited by examiner

Primary Examiner—Viet Q. Nguyen
(74) Attorney, Agent, or Firm—McDermott, Will & Emery

(57) ABSTRACT

A function information storage section of each of a plurality of IPs of a device stores a plurality of sets of correlations between the working voltage V and the processing time T required when operated at this voltage. The device also includes a system controller for controlling the operation of each IP. When the voltage exceeds a limitation at a certain time as a result of analysis, the working voltage of each IP is changed to fall within the limitation.

12 Claims, 3 Drawing Sheets

SEMICONDUCTOR INTEGRATED CIRCUIT DEVICE AND CONTROL METHOD THEREFOR

BACKGROUND OF THE INVENTION

The present invention relates to a semiconductor integrated circuit device including a plurality of circuits and a control method for the same. In particular, the present invention relates to measures for swift control of the device when a limitation is imposed.

In recent years, a concept of system LSI constructed of a plurality of LSI circuits formed on a common substrate has been raised, and various design techniques for system LSI have been suggested. An advantage of the system LSI is that memories such as DRAMs, logic LSI circuits, and analog circuits such as high-frequency circuits can be incorporated in one semiconductor device, to attain semiconductor devices of various types and functions in exceedingly high integration.

In design of the conventional system LSI described above, design properties called cores (or intellectual properties (IPs)) are often used. Such cores are independently designed. Therefore, when the cores are united into a device, smooth operation may not necessarily be secured. In order to design a system that can secure smooth operation, however, enormous amounts of time and effort are actually required since the respective cores or IPs are black boxes.

SUMMARY OF THE INVENTION

An object of the present invention is providing a semiconductor integrated circuit device capable of securing swift operation and a control method therefor. This can be attained, in the case where a plurality of parameters defining operation of a core (or IP) have correlation with each other, by providing a means for controlling such a plurality of parameters in correlation with each other.

The semiconductor integrated circuit device of the present invention includes: a plurality of circuits; information storage means provided for each of the plurality of circuits for storing information on the circuit as a plurality of sets of combinations of a plurality of parameters correlating with each other regarding the operation of the circuit; and control means for controlling each of the circuits to select one set among the plurality of sets stored in the circuit.

With the above construction, a plurality of parameters can be controlled by only selecting one set. This permits swift control while related limitations and targets are taken into consideration.

When at least one parameter among the plurality of parameters is a limitation-imposed parameter for which a limitation range has been set, the control means may select one set among the plurality of sets so that the limitation-imposed parameter falls within the limitation range. This permits swift control within the limitation range.

When at least one parameter among the plurality of parameters is a limitation-imposed parameter for which a limitation range for the entire of the plurality of circuits has been set, the control means may select one set among the plurality of sets so that the limitation-imposed parameter falls within the limitation range. In this case, also, the effect described above is obtained.

The plurality of parameters on the function information may be a voltage and a processing time of the circuit, and when the voltage has a limitation, the control means may change the processing time so that the voltage falls within the limitation range. With this construction, proper management can be done on occasions when the remaining power of a battery is small and when reduction in power consumption is desired.

Preferably, the semiconductor integrated circuit device further includes analysis means for analyzing the states of the plurality of parameters, wherein the control means changes the processing time based on analysis results of the analysis means.

When at least one parameter among the plurality of parameters falls outside a limitation range during operation of the circuit using one set selected from the plurality of sets, the control means may change the set to a set other than the one set among the plurality of sets for at least one circuit among the plurality of circuits.

The control method for a semiconductor integrated circuit device of the present invention is a control method for a semiconductor integrated circuit device including a plurality of circuits, comprising the steps of: (a) storing information on each of the circuits as a plurality of sets of combinations of a plurality of parameters correlating with each other regarding the operation of the circuit; and (b) controlling operation of the circuit by selecting one set among the plurality of sets.

By the above method, a plurality of parameters can be controlled by only selecting one set. This permits swift control while related limitations and targets are taken into consideration.

In the step (b), one set among the plurality of sets may be selected so that at least one parameter among the plurality of parameters does not fall outside a limitation range. This permits swift control within the limitation range.

In the step (b), one set among the plurality of sets may be selected so that at least one parameter among the plurality of parameters does not fall outside a limitation range for the entire of the plurality of circuits. In this case, also, the effect described above is obtained.

In the step (a), a plurality of sets of combinations of a voltage and a processing time of the circuit may be stored as the plurality of parameters on the function information, and in the step (b), when the voltage has a limitation, the processing time may be changed so that the voltage falls within the limitation range. This permits swift control in consideration of the limitation range.

The control method may further include the step of analyzing the states of the plurality of parameters in each of the circuits after the step (a) and before the step (b). This permits swift control even during operation of the device.

In the step (b), when at least one parameter among the plurality of parameters falls outside a limitation range as a result of the step (c) during operation of the circuit using one set selected from the plurality of sets, the set may be changed to a set other than the one set among the plurality of sets for at least one circuit among the plurality of circuits.

DESCRIPTION OF THE PREFERRED EMBODIMENTS

Basic Structure as Precondition of the Present Invention

According to the present invention, as one means for attaining a semiconductor device incorporating devices of various types and functions while securing a large cross-section of interconnections, adopted is a construction where chip IPs incorporating various types of devices are mounted on a semiconductor interconnection substrate including an interconnection layer, such as a silicon interconnection substrate (super-sub). In this construction, circuits (ICs) provided in the respective chip IPs can be handled as IPs (intellectual properties) in design of a semiconductor device, and the resultant semiconductor device can be considered as that obtained by bonding the IPs of various types to the semiconductor interconnection substrate. That is, the entire semiconductor device constitutes "IPs on super-sub". In the embodiment of the present invention, therefore, the entire semiconductor device including a silicon interconnection substrate and IPs is called an "IPOS device".

Figure 1A:
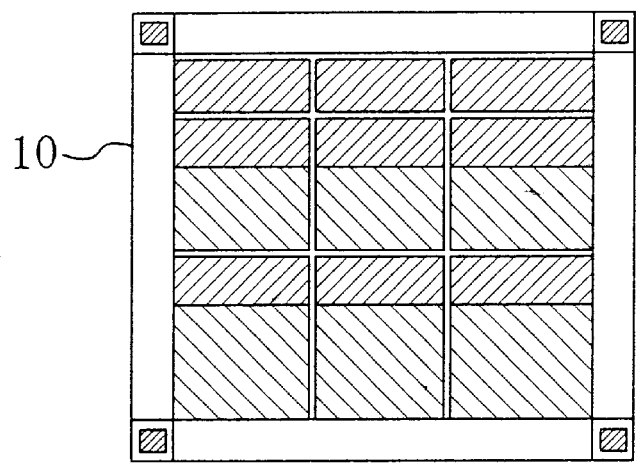
FIGS. 1A, 1B, and 1C are a plan view of a silicon interconnection substrate on which IPs are to be mounted, plan views of examples of IPs to be mounted on the silicon interconnection substrate, and a cross-sectional view of the silicon interconnection substrate, respectively.
Figure 1B:
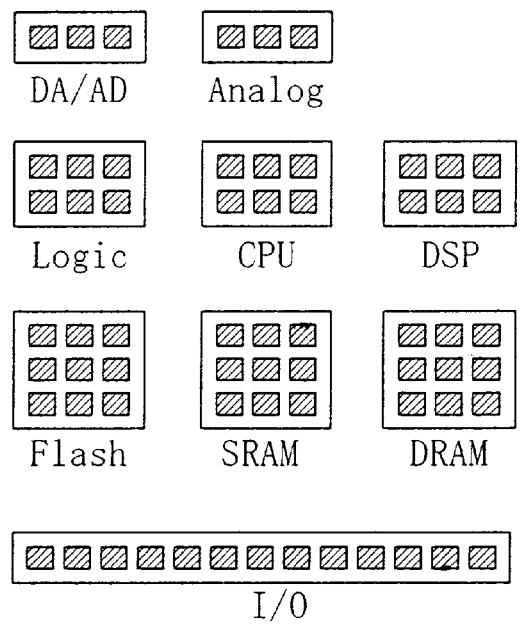
Figure 1C:
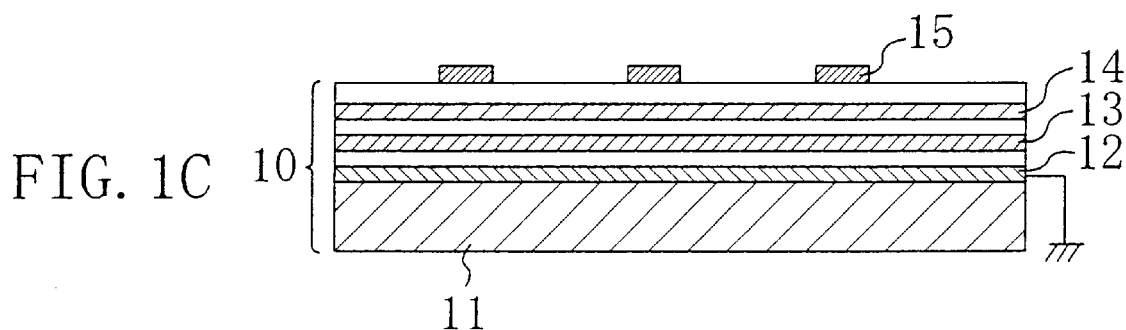

FIGS. 1A, 1B, and 1C are a plan view of a silicon interconnection substrate on which IPs (chip IPs) are to be mounted, plan views of examples of IPs to be mounted on the silicon interconnection substrate, and a cross-sectional view of the silicon interconnection substrate, respectively. As shown in FIGS. 1A and 1B, the top surface of a silicon interconnection substrate 10 has a plurality of regions for mounting various IPs. The regions are prepared to receive various IPs, such as a DA/AD-IP, an analog IP, a logic IP, a CPU IP, a DSP IP, a flash memory IP, a SRAM IP, a DRAM IP, and an I/O IP, in the form of chip IPs. As shown in FIG. 1C, the silicon interconnection substrate 10 includes: a silicon substrate 11; a ground plane 12 formed on the silicon substrate 11 via an insulating film (not shown); a first interconnection layer 13 formed on the ground plane 12 via an interlayer insulating film; a second interconnection layer 14 formed on the first interconnection layer 13 via an interlayer insulating film; and pads 15 formed on the second interconnection layer 14 via a passivation film. The pads 15, the interconnection layers 13 and 14, and the ground plane 12 are connected with each other via respective contacts (not shown) at desired positions. The IPs are bonded to the pads 15 to allow the IPs to be in electrical connection with each other or with the ground plane 12 via the interconnection layers 13 and 14.

Limitation on the sizes of the interconnection layers 13 and 14 of the silicon interconnection substrate 10 is not rigid. Even interconnections having a width of several micrometers are allowed. This enables the following effects. That is, it is empirically possible to provide interconnections having a size adopted in semiconductor integrated circuit devices of a generation in which the characteristics of interconnections were best in the past progress of downsizing of the semiconductor integrated circuit devices. In addition, it is possible to reduce the electrical impedance at the interconnections.

The chip IPs on the silicon interconnection substrate have many functions. In this aspect, two ways of thinking are available: one is to use functions as many as possible, and the other is to limit the function used. To state more specifically, on the one hand, it is preferable to provide a construction adaptable to various uses to respond to a variety of demands of the user. On the other hand, it is required to limit the use to one of the functions during actual use. By satisfying these two conflicting requirements, it is possible to construct an IPOS device that responds to a variety of demands of the user and yet suits to mass production of reduced varieties. For this attainment, required are means for selecting, limiting, and setting the functions of the IPOS device. Specifically, required are a method for evaluating the functions of the chip IPs on the silicon interconnection substrate, a method for selecting the functions, on-chip configurations, and the like. Herein, embodiments of these means will be described.

(Embodiment)

In this embodiment, a structure and a method for enabling examination of functions of IPs provided in an IPOS device will be described.

Figure 2:
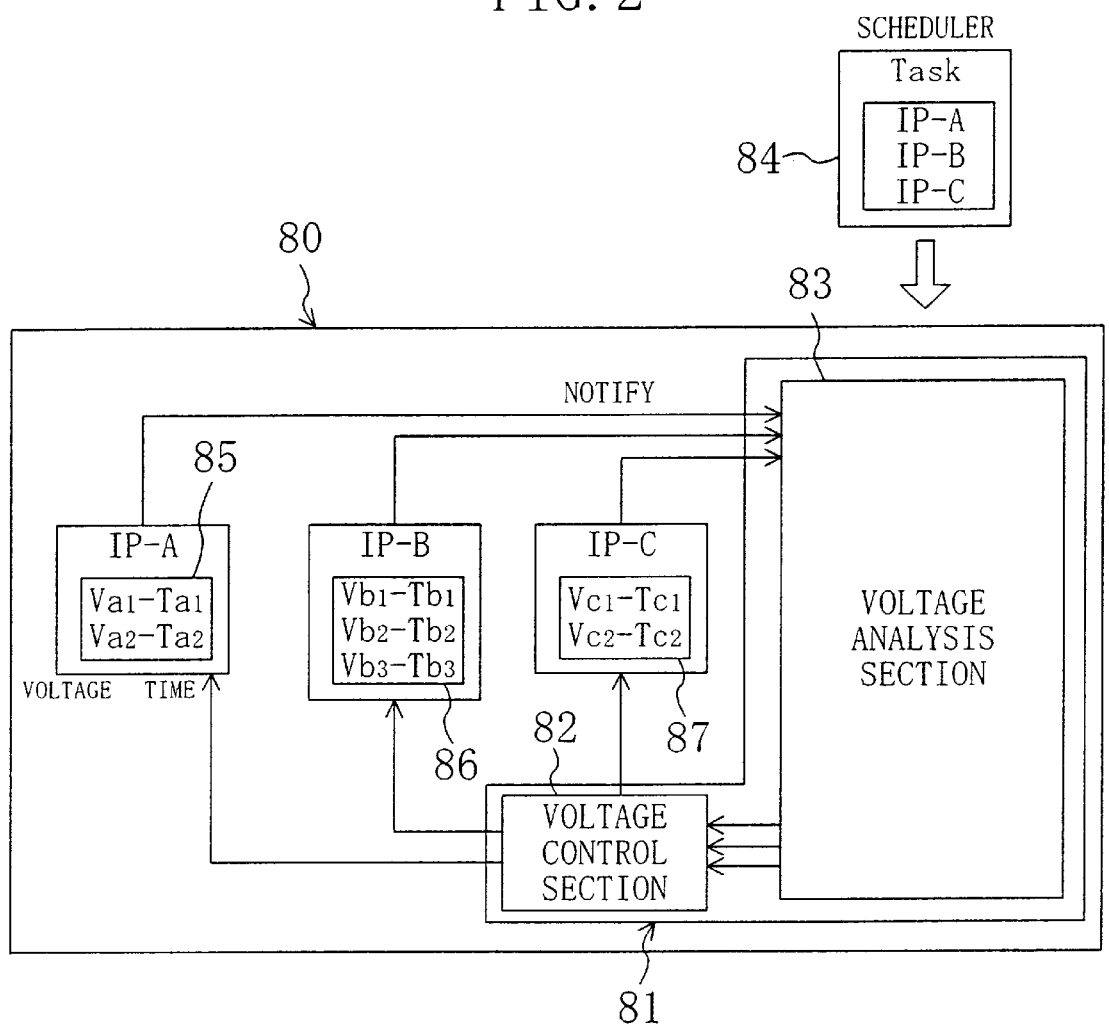
FIG. 2 is a block diagram of a semiconductor integrated circuit device of an embodiment of the present invention.

FIG. 2 illustrates a construction of a semiconductor integrated circuit device of the embodiment of the present invention. An IPOS device 80 includes three IPs, IP-A, IP-B, and IP-C, for example. Function information storage sections 85, 86, and 87 of the IP-A, the IP-B, and the IP-C, respectively, store a plurality of sets of correlations between the working voltage V and the processing time T required when operated at this voltage. The IPOS device 80 also includes a system controller 81 for controlling the operations of the IP-A, the IP-B, and the IP-C. The system controller 81 may be provided externally, not inside the IPOS device 80 as illustrated. The system controller 81 includes a voltage control section 82 for controlling the voltages at the IP-A, the IP-B, and the IP-C, and a voltage analysis section 83 for analyzing the voltages at the IP-A, the IP-B, and the IP-C. A scheduler 84 is provided outside the IPOS device 80 for instructing the order of a task.

Figure 3A:
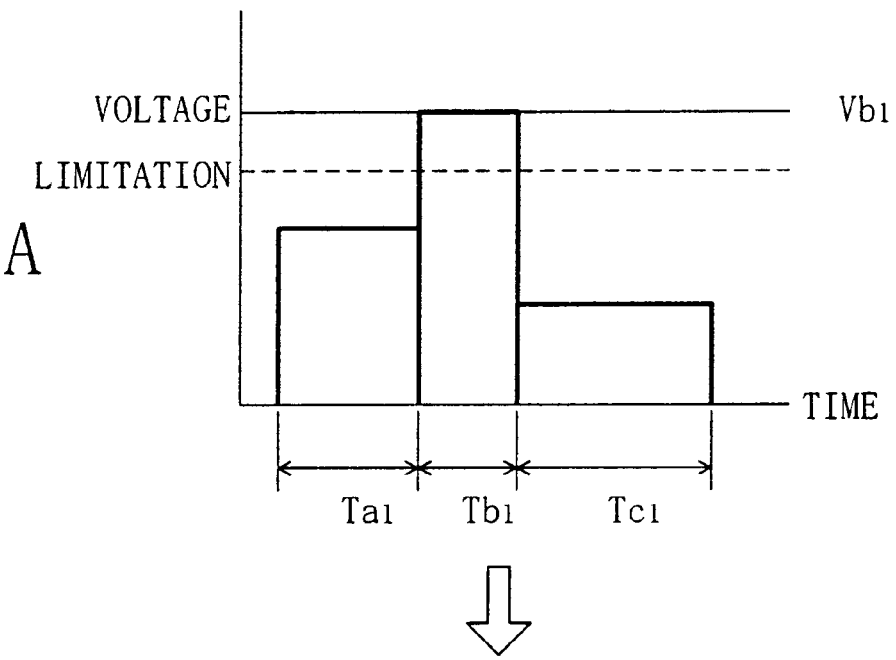
FIGS. 3A and 3B are views showing a change in voltage with time for description of control by a system controller shown in FIG. 2.
Figure 3B:
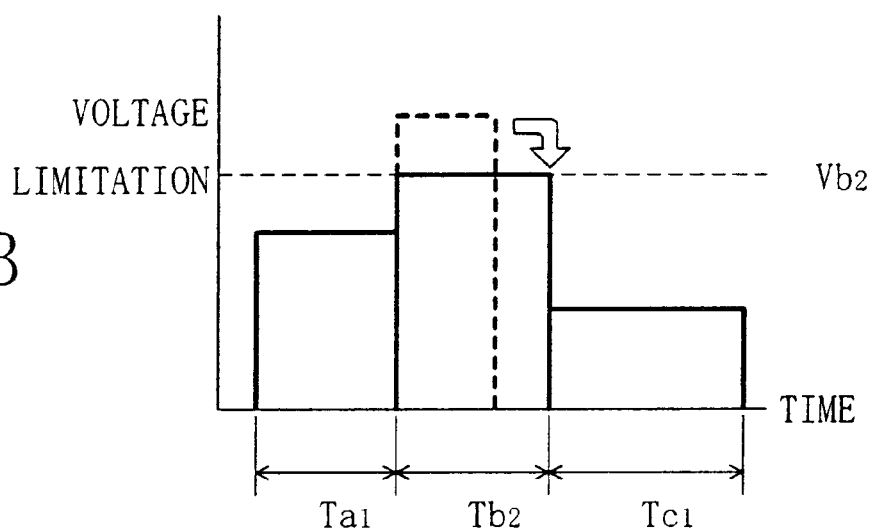

FIGS. 3A and 3B are views showing a change in voltage with time for description of the control by the system controller 81. First, when the voltage analysis section 83 receives the order of processing of a task from the scheduler 84, it analyzes the time schedule of voltages according to the order of processing. If the analysis results indicate that a voltage exceeds a limitation value at a certain time, the working voltage at each IP is changed so as to fall within the limitation value. For example, when a working voltage Vb1 of the IP-B exceeds a limitation value as shown in FIG. 3A, information on the sets of correlations between the working voltage V and the corresponding processing time T is read from the function information storage section 86 of the IP-B, to retrieve Vb2–Tb2 as the set falling within the limitation value. Based on the analysis results, the voltage control section 82 executes control so that the IP-B operates at the voltage Vb2 when it is operated.

Imposing a limitation value on the voltage as described above is necessary in the case where the remaining voltage of a battery is detected and the detected value is set as a limitation value, and in the case where a low-power mode is used when the working power mode is switchable between the low-power mode and a high-speed mode, for example. In reverse, in the case where the high-speed mode is used when the working power mode is switchable between the low-power mode and the high-speed mode, and in the case where the entire processing time has a limitation, control can be made so that the correlation between the working voltage V and the corresponding processing time T is switched to a set of a high working voltage and a short processing time.

By controlling various control parameters as described above to satisfy a certain condition, IPs having various functions can be operated smoothly.

In the above embodiment, application of the present invention to an IPOS device was exemplified. The present invention is not limited to the application to an IPOS device, but can also be applied to the conventional system LSI and other integrated circuit devices.

Parameters other than the voltage and the processing time may also be used. The parameters used may be three or more. Moreover, a plurality of limitation-imposed parameters may be used. That is, not only the voltage but also the processing time may have a limitation.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A semiconductor integrated circuit device comprising:
   a plurality of circuits;
   information storage means provided for each of the plurality of circuits for storing information on the circuit as a plurality of sets of combinations of a plurality of parameters correlating with each other regarding the operation of the circuit; and
   control means for controlling each of the circuits to select one set among the plurality of sets stored in the circuit.

2. The semiconductor integrated circuit device of claim 1, wherein at least one parameter among the plurality of parameters is a limitation-imposed parameter for which a limitation range has been set, and
   the control means selects one set among the plurality of sets so that the limitation-imposed parameter falls within the limitation range.

3. The semiconductor integrated circuit device of claim 1, wherein at least one parameter among the plurality of parameters is a limitation-imposed parameter for which a limitation range for the entire of the plurality of circuits has been set, and
   the control means selects one set among the plurality of sets so that the limitation-imposed parameter falls within the limitation range.

4. The semiconductor integrated circuit device of claim 2, wherein the plurality of parameters on the function information are a voltage and a processing time of the circuit, and
   when the voltage has a limitation, the control means changes the processing time so that the voltage falls within the limitation range.

5. The semiconductor integrated circuit device of claim 4, further comprising analysis means for analyzing the states of the plurality of parameters,
   wherein the control means changes the processing time based on analysis results of the analysis means.

6. The semiconductor integrated circuit device of claim 5, wherein when at least one parameter among the plurality of parameters falls outside a limitation range during operation of the circuit using one set selected from the plurality of sets, the control means changes the set to a set other than the one set among the plurality of sets for at least one circuit among the plurality of circuits.

7. A control method for a semiconductor integrated circuit device including a plurality of circuits, comprising the steps of:
   (a) storing information on each of the circuits as a plurality of sets of combinations of a plurality of parameters correlating with each other regarding the operation of the circuit; and
   (b) controlling operation of the circuit by selecting one set among the plurality of sets.

8. The control method of claim 7, wherein in the step (b), one set among the plurality of sets is selected so that at least one parameter among the plurality of parameters does not fall outside a limitation range.

9. The control method of claim 7, wherein in the step (b), one set among the plurality of sets is selected so that at least one parameter among the plurality of parameters does not fall outside a limitation range for the entire of the plurality of circuits.

10. The control method of claim 7, wherein in the step (a), a plurality of sets of combinations of a voltage and a processing time of the circuit are stored as the plurality of parameters on the function information, and
    in the step (b), when the voltage has a limitation, the processing time is changed so that the voltage falls within the limitation range.

11. The control method of claim 10, further comprising the step of analyzing the states of the plurality of parameters in each of the circuits after the step (a) and before the step (b).

12. The control method of claim 10, wherein in the step (b), when at least one parameter among the plurality of parameters falls outside a limitation range as a result of the step (c) during operation of the circuit using one set selected from the plurality of sets, the set is changed to a set other than the one set among the plurality of sets for at least one circuit among the plurality of circuits.

* * * * *